(12) United States Patent
Hardee

(10) Patent No.: US 6,531,900 B2
(45) Date of Patent: Mar. 11, 2003

(54) NEGATIVE VOLTAGE DRIVER CIRCUIT TECHNIQUE HAVING REDUCED CURRENT FLOW TO THE NEGATIVE SUPPLY VOLTAGE SOURCE

(75) Inventor: Kim Carver Hardee, Colorado Springs, CO (US)

(73) Assignees: United Memories, Inc., Colorado Springs, CO (US); Sony Corporation, Tokyo (JP)

( * ) Notice: Subject to any disclaimer, the term of this patent is extended or adjusted under 35 U.S.C. 154(b) by 0 days.

(21) Appl. No.: 09/803,315

(22) Filed: Mar. 9, 2001

(65) Prior Publication Data

US 2002/0125918 A1 Sep. 12, 2002

(51) Int. Cl.$^7$ ................................................ H03K 3/00
(52) U.S. Cl. ......................... 327/108; 327/170; 326/83
(58) Field of Search ......................... 327/108–112, 170, 327/434, 436, 437; 326/21, 27, 82, 83

(56) References Cited

U.S. PATENT DOCUMENTS 5,777,497 A * 7/1998 Han ........................... 327/108
5,917,348 A * 6/1999 Chow .......................... 327/108

* cited by examiner

Primary Examiner—Kenneth B. Wells
(74) Attorney, Agent, or Firm—William J. Kubida; Peter J. Meza; Hogan & Hartson LLP

(57) ABSTRACT

A negative voltage driver circuit having reduced current flow to the negative supply voltage source and improved reliability comprises first, second and third series coupled switching devices defining an output and intermediate nodes therebetween respectively for coupling a high voltage source to a reference voltage level. Control terminals of the first and second switching devices are coupled to a first circuit node and a control terminal of the third switching device is coupled to a second circuit node. A fourth switching device is coupled between the lower intermediate node and a negative voltage source, with a control terminal of the fourth switching device being coupled to a third circuit node. In operation, the first circuit node is activated, followed sequentially by the second and third circuit nodes, the second circuit node being deactivated substantially concurrently with the activation of the third circuit node.

1 Claim, 2 Drawing Sheets

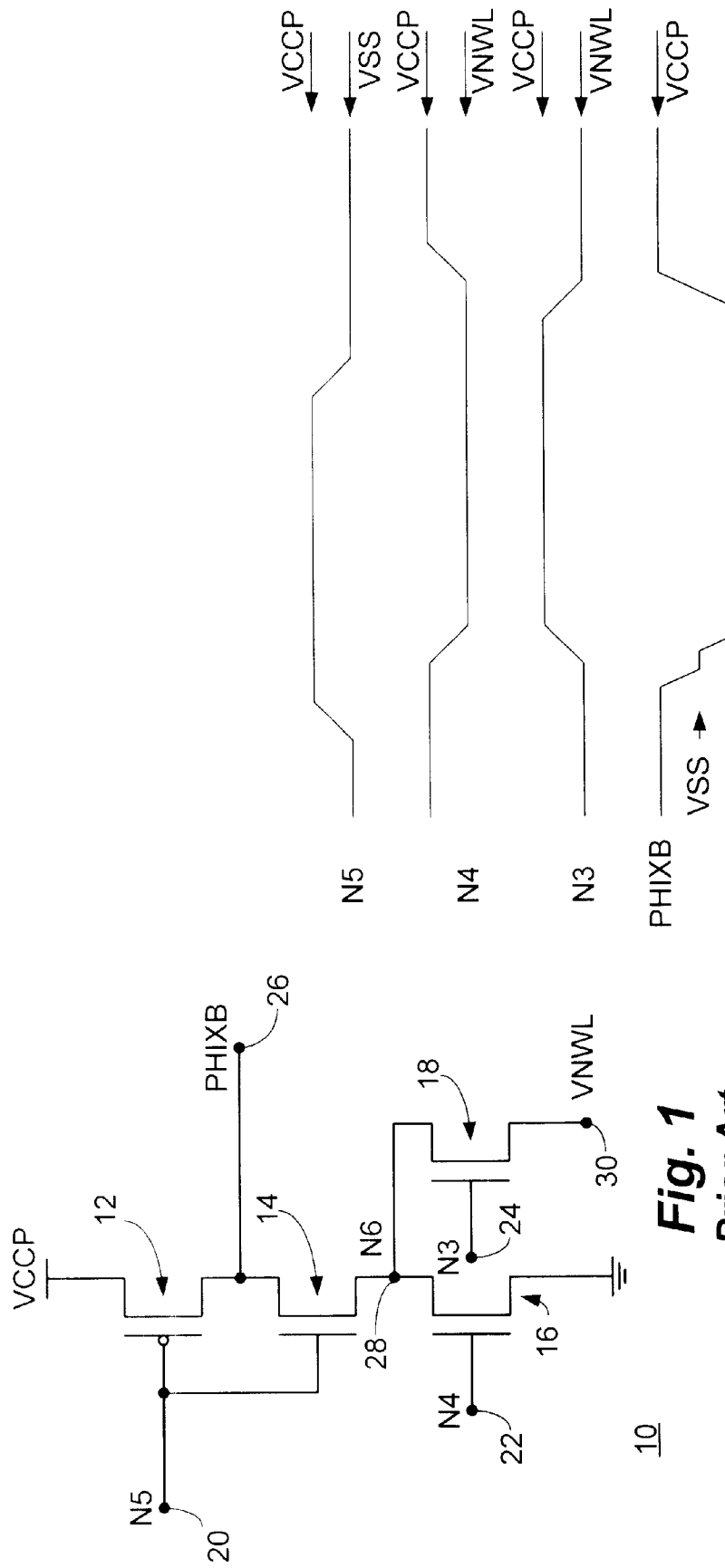

US 6,531,900 B2

NEGATIVE VOLTAGE DRIVER CIRCUIT TECHNIQUE HAVING REDUCED CURRENT FLOW TO THE NEGATIVE SUPPLY VOLTAGE SOURCE

CROSS REFERENCE TO RELATED PATENT APPLICATIONS

The present invention is related to the subject matter disclosed in U.S. patent application Ser. No. 09/803,318 for: "Switching Circuit Utilizing A High Voltage Transistor Protection Technique for Integrated Circuit Devices Incorporating Dual Supply Voltage Sources" filed on even date herewith and assigned to the assignee of the present invention, the disclosure of which is herein specifically incorporated by this reference.

BACKGROUND OF THE INVENTION

The present invention relates, in general, to the field of integrated circuit ("IC") devices. More particularly, the present invention relates to a negative voltage driver circuit having reduced current flow to the negative supply voltage source and overall improved reliability.

Certain dynamic random access memory ("DRAM") designs require a driver circuit capable of driving an output node from a high (or "pumped") voltage level ("VCCP") to a negative supply voltage level ("VNWL") and back to the high voltage level. Among the constraints on such a circuit are that the current provided to the VNWL supply be reduced (due to the fact that the VNWL source is a pumped supply) and that reliable operation be effectuated by ensuring that any N-channel transistor in the driver circuit switch with a drain-to-source voltage ("VDS") equal to or less than VCCP.

SUMMARY OF THE INVENTION

Particularly disclosed herein is a negative voltage driver circuit which comprises: first, second and third series coupled switching devices defining an output and intermediate nodes therebetween respectively for coupling a high voltage source to a reference voltage level. Control terminals of the first and second switching devices are coupled to a first circuit node and a control terminal of the third switching device is coupled to a second circuit node. A fourth switching device is coupled between the lower intermediate node and a negative voltage source, with a control terminal of the fourth switching device being coupled to a third circuit node. In operation, the first circuit node is activated, followed sequentially by the second and third circuit nodes, the second circuit node being deactivated substantially concurrently with the activation of the third circuit node.

Also disclosed herein is a method for operating a negative voltage driver comprising the steps of: coupling an output node to an intermediate circuit node; coupling the intermediate circuit node to a reference voltage level thereby driving the output node to substantially the reference voltage level; and decoupling the intermediate circuit node from the reference voltage level substantially concurrently with coupling the intermediate node to a negative voltage source thereby driving the output node to substantially the negative voltage source level.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIG. 1 is a negative voltage driver circuit illustrating the various waveform designations as well as signal input and output nodes thereof;

FIG. 2 is a timing diagram with representative waveforms for the signals on the various input and output nodes of the negative voltage driver circuit of FIG. 1 in a conventional mode of operation;

DESCRIPTION OF A REPRESENTATIVE EMBODIMENT

Figure 3:
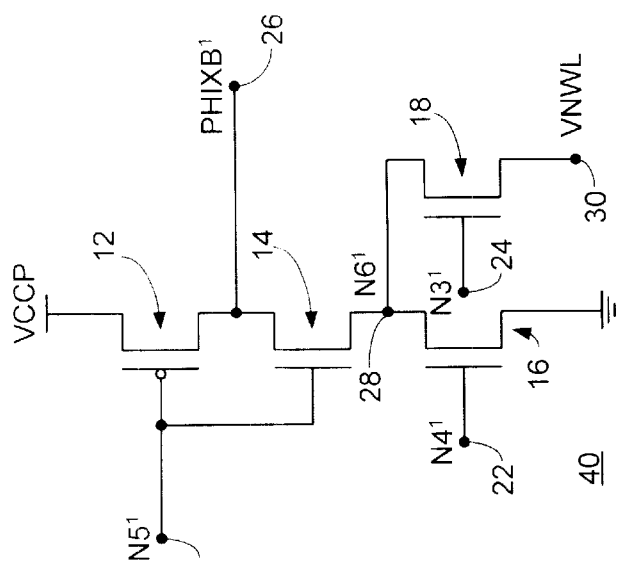
FIG. 3 is a negative voltage driver circuit in accordance with the technique of the present invention illustrating the various waveform designations as well as signal input and output nodes thereof.

With reference now to FIG. 1, a negative voltage driver circuit 10 is shown for utilization in accordance with the technique of the present invention and illustrating the various signal input and output nodes thereof. The driver circuit 10 comprises, in pertinent part, a P-channel transistor 12 coupled in series with series connected N-channel transistors 14 and 16 between a "pumped" high voltage source ("VCCP") and a reference voltage level ("VSS" or circuit ground). An additional N-channel transistor 18 has one terminal coupled intermediate transistors 14 and 16 as shown at node 28 ("N6").

The gate terminal of transistors 12 and 14 are coupled together to an input node 20 ("N5") while the gate terminal of transistor 16 is coupled to another input node 22 ("N4"). The gate terminal of transistor 18 is coupled to an input node 24 ("N3") while its remaining terminal is coupled to the negative voltage supply ("VNWL") at node 30. The output of the driver circuit 10 is taken at node 26 ("PHIXB") intermediate transistors 12 and 14. In a representative embodiment, transistors 12, 14 and 16 may have a channel width of 15 μ and a length of 0.34 μ while transistor 18 may have a channel width of 8 μ and a length of 0.34 μ. In the embodiment of the driver circuit 10 illustrated, a supply voltage ("VCC") may range between approximately 1.4 volts to 1.6 volts with a nominal value of 1.5 volts while VCCP may range substantially between 3.1 volts to 3.6 volts with a nominal value of 3.35 volts. VNWL has a nominal value of −0.5 volts.

With reference additionally now to FIG. 2, a timing diagram with representative waveforms for the signals on the various input and output nodes of the negative voltage driver circuit 10 is shown in a conventional mode of operation. The sequencing of the various signals effectuates the reduction of current into VNWL at node 30 by keeping transistor 18 turned "off" (i.e. node 24 "N3" goes "low") until the PHIXB signal at node 26 is driven near VSS potential. At this point, transistor 16 is turned "off" (i.e. node 22 "N4" goes "low") and transistor 18 is turned "on" (i.e. node 24 "N3" goes "high") to drive the PHIXB to a VNWL potential. This sequence causes most of the current during the discharge of PHIXB to flow into VSS instead of VNWL.

The problem with this timing is that transistor 16 is already "on" when transistor 14 is turned "on". This causes current to flow through transistor 14 as node 20 "N5" goes "high" with a large voltage drain-to-source ("VDS") equal to VCCP. This can cause hot electrons to become trapped in the gate oxide of transistor 14 resulting in a threshold voltage shift and concomitant reduction in gain ("β").

With reference now to FIG. 3, a negative voltage driver circuit 40 in accordance with the technique of the present invention illustrating the various waveform designations as well as signal input and output nodes thereof is shown. Although the circuit configuration remains the same, note that the waveform designations have been changed to N3', N4', N5', N6' and PHIXB'to denote the new waveforms according to the method of the present invention that appear on corresponding nodes 24, 22, 20, 28, and 26 as is explained in further detail below.

Figure 4:
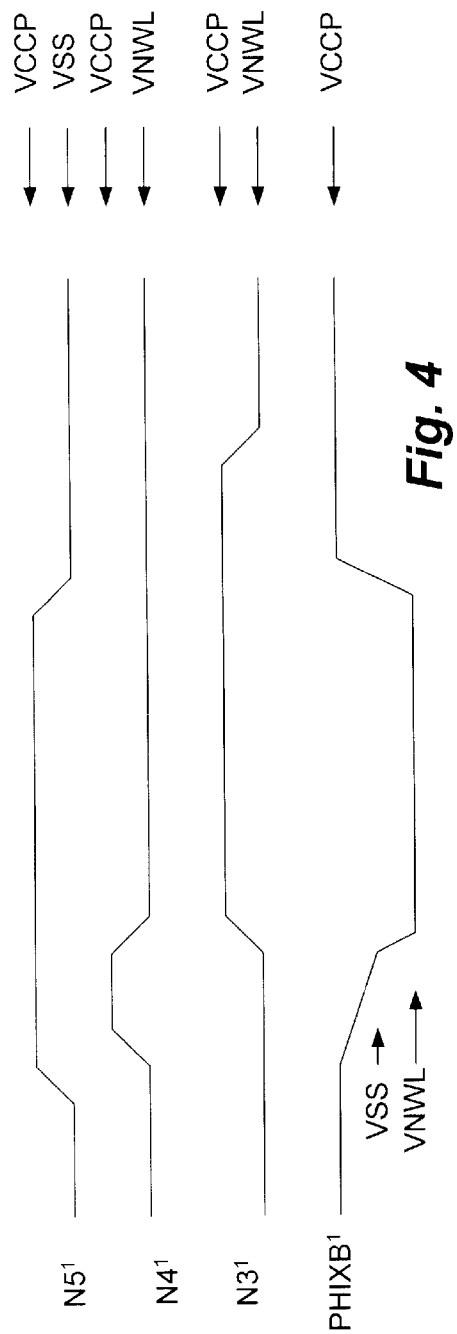
FIG. 4 is a corresponding timing diagram with representative waveforms for the signals on the various input and output nodes of the negative voltage driver circuit of FIG. 3 in accordance with the technique of the present invention.

With reference additionally now to FIG. 4, a corresponding timing diagram with representative waveforms for the signals on the various input and output nodes of the negative voltage driver circuit of FIG. 3 is shown operated in accordance with the technique of the present invention. The potential reliability problem noted above can be alleviated if transistor 16 is turned "on" after transistor 14. Then, as transistor 14 turns "on", its VDS is relatively small (less than VCCP) since no current flows through transistor 14 until transistor 16 turns "on". To effectuate this timing, the signal applied to node 22 "N4'" may be a self-timed pulse with timing substantially as indicated in the figure. For example, in a particular embodiment of the present invention, when PHIXB' goes "low", node 24 "N3'" can be brought "high" which causes node 22 "N4'" to go "low".

While there have been described above the principles of the present invention in conjunction with a specific circuit and timing implementation it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. A method of operating a negative voltage driver circuit of the type having first, second, third, and fourth electrically coupled transistors, in which the first transistor is coupled to a positive voltage source, the third transistor is coupled to ground, and the fourth transistor is coupled to a negative voltage source, the method comprising:

turning off the first transistor and substantially concurrently turning on the second transistor;

subsequently turning on the third transistor while the first transistor is off and the second transistor is on; and subsequently turning off the third transistor and substantially concurrently turning on the fourth transistor.

* * * * *